United States Patent
Hollis

(10) Patent No.: US 10,277,441 B2
(45) Date of Patent: Apr. 30, 2019

(54) UNIFORMITY BETWEEN LEVELS OF A MULTI-LEVEL SIGNAL

(71) Applicant: Micron Technology, Inc., Boise, ID (US)

(72) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/893,089

(22) Filed: Feb. 9, 2018

(65) Prior Publication Data

US 2019/0044769 A1  Feb. 7, 2019

Related U.S. Application Data

(60) Provisional application No. 62/542,181, filed on Aug. 7, 2017.

(51) Int. Cl.
| | |
|---|---|
| H04L 25/03 | (2006.01) |
| H04L 27/08 | (2006.01) |
| G11C 7/10 | (2006.01) |
| H04L 27/04 | (2006.01) |
| H04B 1/04 | (2006.01) |
| H03K 19/00 | (2006.01) |

(52) U.S. Cl.
CPC ............ H04L 27/08 (2013.01); G11C 7/10 (2013.01); H03K 19/0005 (2013.01); H04B 1/0475 (2013.01); H04L 27/04 (2013.01)

(58) Field of Classification Search
CPC ............ H03F 1/3247; H04L 27/368; H04L 25/03343; G06F 13/4072

USPC ............. 375/296, 346; 323/17, 65
See application file for complete search history.

(56) References Cited

U.S. PATENT DOCUMENTS

| | | |
|---|---|---|
| 7,598,762 B2 | 10/2009 | Byun et al. |
| 7,692,447 B2 | 4/2010 | Cranford et al. |
| 7,961,008 B2 | 6/2011 | Kim et al. |
| 8,604,828 B1 | 12/2013 | Bickford et al. |
| 8,816,738 B2 | 8/2014 | Tatapudi et al. |
| 9,444,455 B2 | 9/2016 | Bhuiyan et al. |
| 9,525,573 B2 | 12/2016 | Fiedler |
| 9,577,854 B1 | 2/2017 | Hollis |
| 9,712,257 B1 | 7/2017 | Tan et al. |
| 2013/0163312 A1* | 6/2013 | Chang ............ G11C 11/413 365/156 |
| 2016/0094202 A1* | 3/2016 | Hollis ............ H03K 3/011 327/109 |
| 2016/0181950 A1* | 6/2016 | Yoscovich ...... H02M 7/483 363/131 |
| 2017/0212695 A1 | 7/2017 | Hollis et al. |

* cited by examiner

Primary Examiner — Khai Tran
(74) Attorney, Agent, or Firm — Holland & Hart LLP

(57) ABSTRACT

Methods, systems, and devices for improving uniformity between levels of a multi-level signal are described. Techniques are provided herein to unify peak-to-peak voltage differences between the amplitudes of data transmitted using multi-level signaling. Such multi-level signaling may be configured to increase a data transfer rate without increasing the frequency of data transfer and/or a transmit power of the communicated data. An example of multi-level signaling scheme may be pulse amplitude modulation (PAM). Each unique symbol of the multi-level signal may be configured to represent a plurality of bits of data.

20 Claims, 7 Drawing Sheets

UNIFORMITY BETWEEN LEVELS OF A MULTI-LEVEL SIGNAL

CROSS REFERENCE

The present Application for Patent claims priority to U.S. Patent Application No. 62/542,181 by Hollis et al., entitled "Uniformity Between Levels Of A Multi-Level Signal," filed Aug. 7, 2017, assigned to the assignee hereof, and expressly incorporated by reference herein.

BACKGROUND

The following relates generally to operating a memory array and more specifically to improving uniformity between levels of a multi-level signal.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Some memory devices may transfer data across a large number of channels using multi-level signaling. Such multi-level signaling may be configured to increase a data transfer rate without increasing the frequency of data transfer and/or a transmit power of the communicated data. An example of a multi-level signaling scheme may be pulse amplitude modulation (PAM4, PAM8, etc.), where unique symbol of the multi-level signal may be configured to represent a plurality of bits of data.

In PAM4 signaling schemes, a peak-to-peak voltage difference between the various amplitudes of transferred data may exist. For example, smaller peak-to-peak margins may result from additional noise and, as a result, additional errors in the transmitted data. Alternatively, for example, larger peak-to-peak margins may result from reduced noise and, as a result, fewer errors in the data. Thus large, uniform peak-to-peak margins are desirable.

In some examples, calibrating the signal levels of multi-leg drivers may result in larger, more-uniform peak-to-peak margins. To calibrate the driver signal levels, data output from the driver may be received and analyzed. In analyzing the data signal, an offset in an impedance level of each data signal may be determined. This impedance offset may correspond to a peak-to-peak difference between the various amplitudes of the transmitted data. Upon determining an impedance offset, for example, a resistance level of one or more driver legs may be adjusted. This adjustment (e.g., a calibration) may result in more-uniform peak-to-peak margins of the transmitted data.

Features of the disclosure introduced above are further described below in the context of a memory device. Specific examples are then described for a memory device that supports improving uniformity between levels of a multi-level signal. These and other features of the disclosure are further illustrated by and described with reference to apparatus diagrams, system diagrams, and flowcharts that relate to multi-level signaling.

Figure 1:
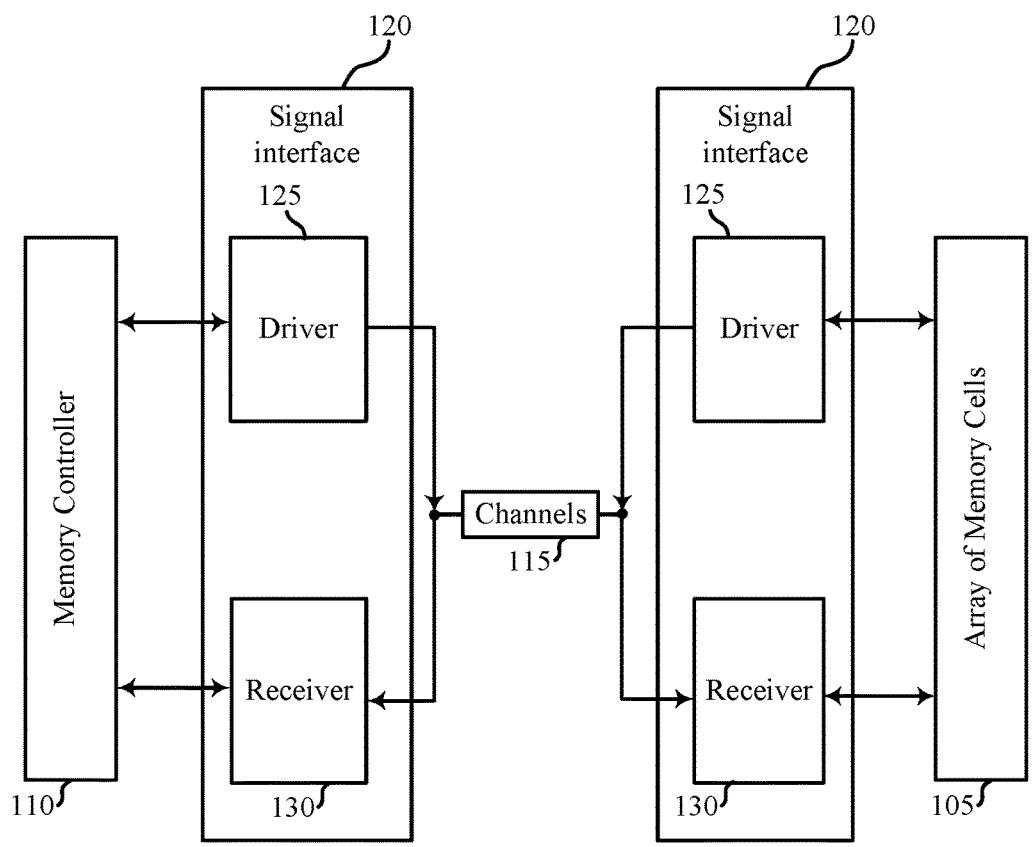
FIG. 1 illustrates an example of a memory device that supports features and operations of improving uniformity between levels of a multi-level signal in accordance with examples of the present disclosure.

FIG. 1 illustrates an example memory subsystem 100 in accordance with various examples of the present disclosure. The memory subsystem 100 may also be referred to as an electronic memory apparatus. The memory subsystem 100 may be configured to utilize multi-level signaling to communicate data between various components of the memory subsystem 100. Some examples of the multi-level signaling may include PAM signaling such as PAM4 signaling, PAM8 signaling, etc. The memory subsystem 100 may include an array of memory cells 105, a controller 110, a plurality of channels 115, signaling interfaces 120, other components, or a combination thereof.

A memory subsystem 100 may use multi-level signaling to increase an amount of information transmitted using a given bandwidth of frequency resources. In binary signaling, two symbols of a signal (e.g., two voltages levels) are used to represent up to two logic states (e.g., logic state '0' or logic state '1'). In multi-level signaling, a larger library of symbols may be used to represent data. Each symbol may represent more than two logic states (e.g., logic states with multiple bits). For example, if the signal is capable of four unique symbols, the signal may be used to represent up to four logic states (e.g., '00', '01', '10', and '11'). As a result, multiple bits of data may be compressed into a single symbol, thereby increasing the amount of data communicated using a given bandwidth.

In some cases of multi-level signaling, the amplitude of the signal may be used to generate the different symbols. For example, a first amplitude level may represent '00', a second amplitude level may represent '01', a third amplitude level may represent '10', and a fourth amplitude level may represent '11'. One drawback of some multi-level signaling schemes is that the symbols may be separated by a smaller voltage than symbols in a binary signaling scheme. The smaller voltage separation may make the multi-level signaling scheme more susceptible to errors caused by noise or other aspects. The voltage separation of symbols in the multi-level signaling scheme, however, may be expanded by increasing a peak-to-peak transmitted power of a transmitted signal. In some situations, however, such an increase to peak-to-peak transmitted power may not be possible or may be difficult due to fixed power supply voltages, fixed signal power requirements, or other factors. Consequently, to implement multi-level signaling a transmitter may utilize more power and/or a receiver may be susceptible to an increased error rate, when compared to a binary signaling scheme.

A multi-level signal (sometimes referred to as a multi-symbol signal) may be a signal that is modulated using a modulation scheme that includes three or more unique symbols to represent data (e.g., one or more bits of data). The multi-level signal may be an example of an M-ary signal that is modulated using a modulation scheme where M is greater than or equal to three, where M represents the number of unique symbols, levels, or conditions possible in the modulation scheme. A multi-level signal or a multi-level modulation scheme may be referred to as a non-binary signal or non-binary modulation scheme in some instances. Examples of multi-level (or M-ary) modulation schemes related to a multi-level signal may include, but are not limited to, pulse amplitude modulation (e.g., PAM4, PAM8), quadrature amplitude modulation (QAM), quadrature phase shift keying (QPSK), and/or others.

A binary-level signal (sometimes referred to as a binary-symbol signal) may be a signal that is modulated using a modulation scheme that includes two unique symbols to represent one bit of data. The binary-level signal may be an example of an M-ary modulation scheme where M is less than or equal to 2. Examples of binary-level modulation schemes related to a binary-level signal include, but are not limited to, non-return-to-zero (NRZ), unipolar encoding, bipolar encoding, Manchester encoding, PAM2, and/or others.

Each memory cell of the array of memory cells 105 may be programmable to store different states. For example, each memory cell may be programmed to store two or more logic states (e.g., a logic '0', a logic '1', a logic '00', a logic '01', a logic '10', a logic '11', etc.). A memory cell may store a charge representative of the programmable states in a capacitor; for example, a charged and uncharged capacitor may represent two logic states, respectively. The memory cells of the array of memory cells 105 may use any number of storage mediums including DRAM, FeRAM, PCM, or other types of memory cells. A DRAM memory cell may include a capacitor with a dielectric material as the insulating material. For example, the dielectric material may have linear or para-electric electric polarization properties and a ferroelectric memory cell may include a capacitor with a ferroelectric material as the insulating material. In instances where the storage medium includes FeRAM, different levels of charge of a ferroelectric capacitor may represent different logic states.

The array of memory cells 105 may be or include a three-dimensional (3D) array, where multiple two-dimensional (2D) arrays or multiple memory cells are formed on top of one another. Such a configuration may increase the number of memory cells that may be formed on a single die or substrate as compared with 2D arrays. In turn, this may reduce production costs or increase the performance of the memory array, or both. Each level of the array may be aligned or positioned so that memory cells may be approximately aligned with one another across each level, forming a memory cell stack.

In some examples, the array of memory cells 105 may include a memory cell, a word line, a digit line, and a sense component. In some examples, the array of memory cells 105 may include a plate line (e.g., in the case of FeRAM). A memory cell of the array of memory cells 105 may include a selection component and a logic storage component, such as capacitor that includes a first plate, a cell plate, a second plate, and a cell bottom. The cell plate and cell bottom may be capacitively coupled through an insulating material (e.g., dielectric, ferroelectric, or PCM material) positioned between them.

The memory cell of the array of memory cells 105 may be accessed (e.g., during a read operation, write operation, or other operation) using various combinations of word lines, digit lines, and/or plate lines. In some cases, some memory cells may share access lines (e.g., digit lines, word lines, plate lines) with other memory cells. For example, a digit line may be shared with memory cells in a same column, a word line may be shared with memory cells in a same row, and a plate line may be shared with memory cells in a same section, tile, deck, or multiple decks. As described above, various states may be stored by charging or discharging the capacitor of the memory cell.

The stored state of the capacitor of the memory cell may be read or sensed by operating various elements. The capacitor may be in electronic communication with a digit line. The capacitor may be isolated from digit line when selection component is deactivated, and capacitor can be connected to digit line when selection component is activated (e.g., by the word line). Activating selection component may be referred to as selecting a memory cell. In some cases, the selection component may be a transistor and its operation may be controlled by applying a voltage to the transistor gate, where the voltage magnitude is greater than the threshold magnitude of the transistor. The word line may activate the selection component; for example, a voltage applied to a transistor gate of a word line may connect a capacitor of a memory cell with a digit line.

The change in voltage of a digit line may, in some examples, depend on its intrinsic capacitance. That is, as charge flows through the digit line, some finite charge may be stored in the digit line and the resulting voltage depends on the intrinsic capacitance. The intrinsic capacitance may depend on physical characteristics, including the dimensions, of the digit line. The digit line may connect many memory cells of the array of memory cells 105 so digit line may have a length that results in a non-negligible capacitance (e.g., on the order of picofarads (pF)). The resulting voltage of the digit line may then be compared to a reference voltage (e.g., a voltage of a reference line) by a sense component in order to determine the stored logic state in the memory cell. Other sensing processes may be used.

The sense component may include various transistors or amplifiers to detect and amplify a difference in signals, which may be referred to as latching. The sense component may include a sense amplifier that receives and compares the voltage of the digit line and a reference line, which may be a reference voltage. The sense amplifier output may be driven to the higher (e.g., a positive) or lower (e.g., negative or ground) supply voltage based on the comparison. For instance, if the digit line has a higher voltage than reference line, then the sense amplifier output may be driven to a positive supply voltage.

In some cases, the sense amplifier may drive the digit line to the supply voltage. The sense component may then latch the output of the sense amplifier and/or the voltage of the digit line, which may be used to determine the stored state in the memory cell (e.g., logic '1'). Alternatively, for example, if the digit line has a lower voltage than reference line, the sense amplifier output may be driven to a negative or ground voltage. The sense component may similarly latch the sense amplifier output to determine the stored state in the memory cell (e.g., logic '0'). The latched logic state of the memory cell may then be output, for example, through a column decoder.

To write a memory cell, a voltage may be applied across the capacitor of the memory cell. Various methods may be used to write a memory cell. In one example, the selection component may be activated through a word line in order to electrically connect the capacitor to the digit line. A voltage may be applied across the capacitor by controlling the voltage of the cell plate (e.g., through a plate line) and the cell bottom (e.g., through a digit line). To write a logic '0', the cell plate may be taken high (e.g., a voltage level may be increased above a predetermined voltage that is a "high" voltage). That is, a positive voltage may be applied to plate line, and the cell bottom may be taken low (e.g., virtually grounding or applying a negative voltage to the digit line). The opposite process may be performed to write a logic '1', where the cell plate is taken low and the cell bottom is taken high.

The controller 110 may control the operation (e.g., read, write, re-write, refresh, decharge, etc.) of memory cells in the array of memory cells 105 through the various components (e.g., row decoders, column decoders, and sense components). In some cases, one or more of the row decoder, column decoder, and sense component may be co-located with the controller 110. Controller 110 may generate row and column address signals in order to activate the desired word line and digit line. In other examples, controller 110 may generate and control various voltages or currents used during the operation of memory subsystem 100. For example, controller 110 may apply discharge voltages to a word line or digit line after accessing one or more memory cells. In general, the amplitude, shape, or duration of an applied voltage or current discussed herein may be adjusted or varied and may be different for the various operations discussed in operating the memory subsystem 100. Furthermore, one, multiple, or all memory cells within the array of memory cells 105 may be accessed simultaneously. For example, multiple memory cells or all memory cells of the array of memory cells 105 may be accessed simultaneously during a reset operation in which multiple memory cells or all memory cells may be set to a single logic state (e.g., logic '0').

Each of the plurality of channels 115 may be configured to couple the array of memory cells 105 with the controller 110. In exome examples, each of the plurality of channels 115 may be referred to as a plurality of legs. In other examples, each of the plurality of channels may be referred to as a first leg group or a second leg group. In some memory devices, the rate of data transfer between the memory device and a host device (e.g., a personal computer or other computing device) may be limited by the rate of data transferred across the plurality of channels 115. In some examples, the memory subsystem 100 may include a large number of high-resistance channels. By increasing the number of channels, the amount of data transferred in the memory subsystem 100 may be increased without increasing the data rate of the transfer. In some examples, the plurality of channels 115 may be referred to as a wide system interface. Each of the plurality of channels 115 may be part of an interposer positioned between the array of memory cells 105 and the controller 110. In some examples, one or more of the channels 115 may be unidirectional and in other examples, one or more of the channels 115 may be bidirectional.

In some examples, at least some (and in some cases, each) of the signaling interfaces 120 may generate and/or decode signals communicated using the plurality of channels 115. A signaling interface 120 may be associated with each component that is coupled with the plurality of channels 115. The signaling interface 120 may be configured to generate and/or decode multi-level signals, binary signals, or both (e.g., simultaneously). Each signaling interface 120 may include a driver 125 and a receiver 130. In some examples, each driver 125 may be referred to as a multi-leg driver.

Each driver 125 may be configured to generate a multi-level signal based on a logic state that includes multiple bits. For example, driver 125 may use PAM4 signaling techniques (or other types of multi-level signaling techniques) to generate a signal having an amplitude that corresponds to the logic state. The driver 125 may be configured to receive data using a single input line. In some cases, the driver 125 may include a first input line for a first bit of data (e.g., most-significant bit), a second input line for a second bit of data (e.g., least-significant bit). In some circumstances, the driver 125 may be configured to generate a binary-level signal (e.g., a NRZ signal). In some cases, the driver 125 may use single-ended signaling to generate the multi-level signal. In such cases, the multi-level signal may be transmitted without a complimentary component.

In some cases, each driver 125 may be referred to as a multi-leg driver 125. Each multi-leg driver 125 may include a first plurality of legs coupled with a first resistive component (e.g., a transistor or a resistor). In other examples, each multi-leg driver 125 may include a second plurality of legs coupled with a second resistive component (e.g., a transistor or a resistor). Each of the first plurality of legs and the second plurality of legs may be configured to output first data and second data, respectively. Each of the first data and the second data may include multiple bits of data.

Additionally or alternatively, for example, each multi-leg driver may be coupled with memory controller 110. In some examples, the memory controller 110 may be configured to determine an output impedance offset between the first output data and the second output data. Stated alternatively, the transmission of each of the first data and the second data may be associated with a specific impedance level. In some examples, memory controller 110 may be configured to determine a difference (e.g., an offset) between the impedance level of each of the first data and the second data.

Each receiver 130 may be configured to determine a logic state represented by a symbol of the multi-level signal received using the plurality of channels 115. In some cases, the receiver 130 may determine an amplitude of the received multi-level signal. Based on the determined amplitude, the receiver 130 may determine the logic state represented by the multi-level signal. The receiver 130 may be configured to output data using a single output line.

In some cases, the receiver 130 may include a first output line for a first bit of data (e.g., most-significant bit), a second output line for a second bit of data (e.g., least-significant bit). In some circumstances, the receiver 130 may be configured to decode a binary-level signal (e.g., a NRZ signal). For example, each of receivers 130 may be coupled with a transmitter (not illustrated) via a plurality of channels 115. Each of the channels 115 may be configured to output data that includes multiple bits, and the controller 110 may be configured to determine an output impedance offset between the data output. One or more resistive components (not separately illustrated) may be configured to adjust a resistance level one or more of the pluralities of channels 115. This adjustment may be based at least in part on the determined output impedance offset. For example, the adjustment may be based on enabling at least one channel 115 of the plurality of channels 115. The at least one channel 115 may, for example, be associated with a bit of data (e.g., a most-significant bit of data, a least-significant bit of data)—meaning that the receiver 130 may output a bit of data (e.g., the most-significant bit of data, the least-significant bit of data) via a corresponding output line. The corresponding output line may be selected based on enabling at least one channel 115 of the plurality of channels 115. In other examples, the adjustment may be based in part on disabling at least one channel 115 of the plurality of channels 115. In some examples, the adjusted resistance level may be based at least in part on adjusting a resistance of the one or more resistive components.

For example, each of the channels 115 may be coupled with a transmitter. In some examples, the transmitter may be coupled with each of the multi-leg drivers 125, memory controller 110, and each receiver 130 and may be configured to transmit first data and second data. Additionally or alternatively, for example, one or more transistors may be coupled with the transmitter and configured to adjust a resistance level of at least one of a first plurality of channels 115. For example, first data and second data may be transmitted via a transmitter. Subsequently, for example, memory controller 110 may be configured to determine the output impedance offset, as discussed above, between the first transmitted data and the second transmitted data. Each of a first transistor and/or a second transistor may be coupled with the transmitter and configured to adjust a resistance level of at least one channel 115 based at least in part on the determination of the output impedance offset.

In some cases, each of the signaling interfaces 120 may be configured to selectively generate and/or decode different types of signals (e.g., NRZ signals, PAM4 signals, PAM8 signals, etc.). Different types of signals may be used based on the operational circumstances of the memory subsystem 100. For example, binary signaling may use less power than multi-level signaling and may be used when power consumption is driving consideration for performance. Other performance factors that may be used to determine which type of signaling should be used may include clock considerations, data strobe (DQS) considerations, circuit capabilities, bandwidth considerations, jitter considerations, or combinations thereof. In some cases, the controller 110 may be configured to select the type of signal, and the signaling interfaces 120 may be configured to implement the selection based on instructions received from the controller 110. In some cases, each of the signaling interfaces 120 may be configured to implement coding functions such as error detection procedures, error correction procedures, data bus inversion procedures, or combinations thereof.

In some cases, the signaling interfaces 120 may be configured to communicate multi-level signals and binary signals simultaneously. In such cases, a signaling interface 120 may include more than one set of drivers 125 and receivers 130. For example, a signaling interface 120 may be configured to communicate a first set of data (e.g., a control signal) using a binary-level signal using a first set of channels 115 at the same time that a second set of data (e.g., user information) is being communicated using a multi-level signal using a second set of channels 115.

Figure 2:
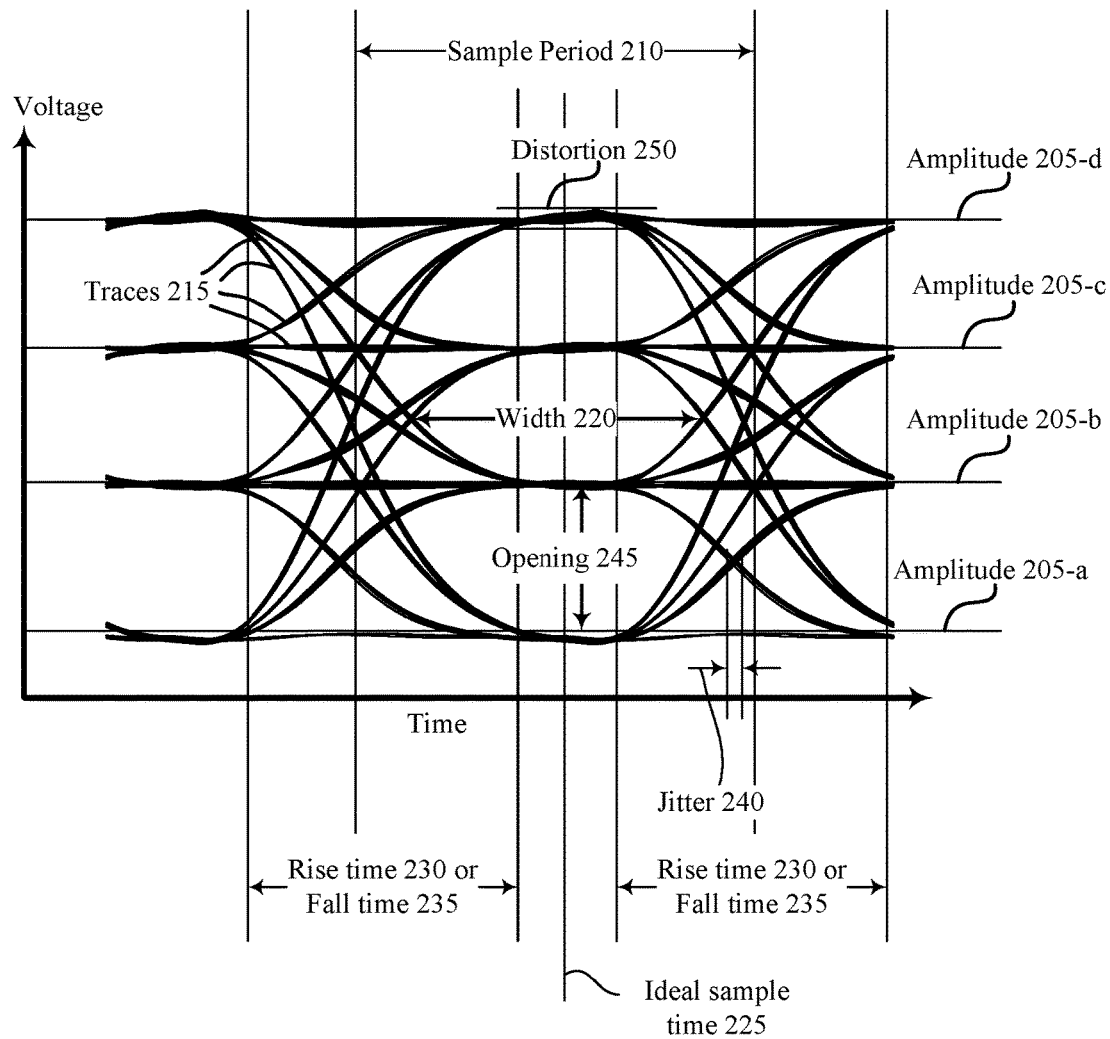
FIG. 2 illustrates an example of an eye diagram for a cell that supports features and operations of improving uniformity between levels of a multi-level signal in accordance with examples of the present disclosure.

FIG. 2 illustrates an example of an eye diagram 200 representing a multi-level signal in accordance with various embodiments of the present disclosure. The eye diagram 200 may be used to indicate the quality of signals in high-speed transmissions and may represent four symbols of a signal (e.g., '00', '01', '10', or '11'). In some examples, each of the four symbols may be represented by a different voltage amplitude (e.g., amplitudes 205-*a*, 205-*b*, 205-*c*, 205-*d*). In other examples, the eye diagram 200 may represent a PAM4 signal that may be used to communicate data in a memory device (e.g., memory subsystem 100 as described with reference to FIG. 1). The eye diagram 200 may be used to provide a visual indication of the health of the signal integrity, and may indicate noise margins of the data signal. The noise margin may, for example, refer to an amount by which the signal exceeds the ideal boundaries of the amplitudes 205.

To generate the eye diagram 200, an oscilloscope or other computing device may sample a digital signal according to a sample period 210 (e.g., a unit interval or a bit period). The sample period 210 may be defined by a clock associated with the transmission of the measured signal. In some examples, the oscilloscope or other computing device may measure the voltage level of the signal during the sample period 210 to form a trace 215. Noise and other factors can result in the traces 215 measured from the signal deviating from a set of ideal step functions. By overlaying a plurality of traces 215, various characteristics about the measured signal may be determined. For example, the eye diagram 200 may be used to identify a number of characteristics of a communication signals such as jitter, cross talk, electromagnetic interference (EMI), signal loss, signal-to-noise ratio (SNR), other characteristics, or combinations thereof. A closed eye may indicate a noisy and/or unpredictable signal or other problems.

In some examples, the eye diagram 200 may indicate a width 220. The width 220 of an eye in the eye diagram 200 may be used to indicate a timing synchronization of the measured signal or jitter effects of the measured signal. In some examples, comparing the width 220 to the sample period 210 may provide a measurement of SNR of the measured signal. Each eye in an eye diagram may have a unique width based on the characteristics of the measured signal. Various encoding and decoding techniques may be used to modify the width 220 of the measured signal.

In other examples, the eye diagram 200 may indicate a sampling time 225 (e.g., an ideal sampling time) for determining the value of a logic state represented by a symbol of the measured signal. For example, determining a correct time for sampling data (e.g., timing synchronization) of the measured signal may be important to minimize the error rate in detection of the signal. For example, if a computing device samples a signal during a transition time (e.g., a rise time 230 or a fall time 235), errors may be introduced by the decoder into the data represented by a symbol of the signal. Various encoding and decoding techniques may be used to modify the ideal sampling time 225 of the measured signal.

The eye diagram 200 may be used to identify a rise time 230 and/or a fall time 235 for transitions from a first amplitude 205 to a second amplitude 205. The slope of the trace 215 during the rise time 230 or fall time 235 may indicate the signal's sensitivity to timing error, among other aspects. For example, the steeper the slope of the trace 215 (e.g., the smaller the rise time 230 and/or the fall times 235), the more ideal the transitions between amplitudes 205 are. Various encoding and decoding techniques may be used to modify the rise time 230 and/or fall time 235 of the measured signal.

In some examples, the eye diagram 200 may be used to identify an amount of jitter 240 in the measured signal. Jitter 240 may refer to a timing error that results from a misalignment of rise and fall times. Jitter 240 occurs when a rising edge or falling edge occurs at a time that is different from an ideal time defined by the data clock. Jitter 240 may be caused by signal reflections, intersymbol interference, crosstalk, process-voltage-temperature (PVT) variations, random jitter, additive noise, or combinations thereof. Various encoding and decoding techniques may be used to modify the jitter 240 of the measured signal. In some cases, the jitter 240 for each signal level or each eye may be different.

In other examples, the eye diagram 200 may indicate an eye opening 245, which may represent a peak-to-peak voltage difference between the various amplitudes 205. The eye opening 245 may be related to a voltage margin for discriminating between different amplitudes 205 of the measured signal. The smaller the margin, the more difficult it may be to discriminate between neighboring amplitudes, and the more errors that may be introduced due to noise. In some cases, a receiver (e.g., receiver 130 as described with reference to FIG. 1) of the signal may compare the signal to one or more threshold voltages positioned between the various amplitudes 205. In other cases, the larger the eye opening 245, the less likely it is that noise will cause the one or more voltage thresholds to be satisfied in error. The eye opening 245 may be used indicate an amount of additive noise in the measured signal, and may be used to determine a SNR of the measured signal. Various encoding and decoding techniques may be used to modify the eye opening 245 of the measured signal. In some cases, the eye opening 245 for each eye may be different. In such cases, the eyes of the multi-level signal may not be identical.

As discussed above, a memory device (e.g., memory subsystem 100 as described with reference to FIG. 1) may include a multi-leg driver (e.g., multi-leg driver 125 as described with reference to FIG. 1) that includes a first plurality of legs (e.g., channels 115 as described with reference to FIG. 1) coupled with a first resistive component and a second plurality of legs (e.g., channels 115 as described with reference to FIG. 1) coupled with a second resistive component. Each of the first plurality of legs and the second plurality of legs may be configured to output first data and second data, respectively. Additionally or alternatively, for example, a memory controller (e.g., memory controller 110 as described with reference to FIG. 1) and/or a transmitter may be coupled with the multi-leg driver. The transmitter may be configured to transmit each of the first data and the second data.

Each of the transmitted first data and second data may contain an eye opening 245, which may represent a peak-to-peak voltage difference between the various amplitudes 205. A memory controller (e.g., memory controller 110 as described with reference to FIG. 1) may determine a difference (e.g., an offset) between two or more eye openings 245, which may result from the first data and the second data. Additionally or alternatively, for example, a memory controller may initiate an adjustment of a resistance level of at least one leg of a first plurality of legs of the multi-leg driver to a second resistance level different than a first resistance level based at least in part on the determination. In some examples, the initiated adjustment may be performed by a transistor in electronic communication with at least one of the first plurality of legs. This adjustment may result in larger, more-uniform eye openings 245.

In other examples, the eye diagram 200 may indicate distortion 250. The distortion 250 may represent overshoot and/or undershoot of the measured signal due to noise or interruptions in the signal path. As a signal settles into a new amplitude (e.g., amplitude 205-$b$) from an old amplitude (e.g., an amplitude 205-$c$), the signal may overshoot and/or undershoot the new amplitude level. In some examples, distortion 250 may be caused by this overshooting and/or undershooting, and may be caused additive noise in the signal or interruptions in the signal path. Each eye in an eye diagram may have a unique opening based on the characteristics of the measured signal. Various encoding and decoding techniques may be used to modify the distortion 250 of the measured signal. In some cases, the distortion 250 for each signal level or each eye may be different.

The locations of the characteristics of the eye diagram 200 shown in FIG. 2 are for illustrative purposes only. Characteristics such as width 220, sampling time 225, rise time 230, fall time 235, jitter 240, eye opening 245, and/or distortion 250 may occur in other parts of the eye diagram 200 not specifically indicated in FIG. 2.

Figure 3:
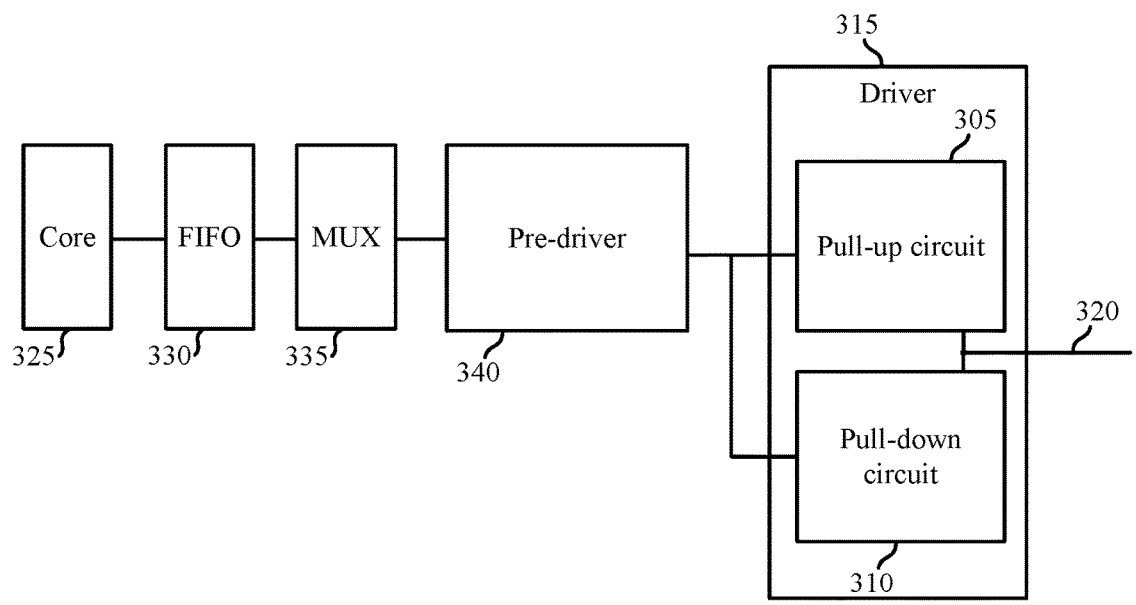
FIG. 3 illustrates an example of a memory device that supports features and operations of improving uniformity between levels of a multi-level signal in accordance with examples of the present disclosure.

FIG. 3 illustrates an example of a multi-leg driver 300 in accordance with various embodiments of the present disclosure. The multi-leg driver 300 may be configured to generate a multi-level signal or a binary signal based on a one or more bits of data. The multi-leg driver 300 may be an example of the driver 125 as described with reference to FIG. 1. The multi-leg driver 300 may include a pull-up circuit 305 and a pull-down circuit 310. The multi-leg driver 300 may be configured to output a signal 320 to a plurality of channels (e.g., channels 115 described with reference to FIG. 1) based on a logic state received from memory core 325. In some examples, multi-leg driver 300 may be coupled with memory core 325, which may be an example of array of memory cells 105 as described with reference to FIG. 1. In other examples, memory core 325 may be coupled with a memory controller (e.g., memory controller 110 as described with reference to FIG. 1).

In some examples, the multi-leg driver 300 may operate based on data received from memory core 325. For example, a memory controller (e.g., memory controller 110 as described with reference to FIG. 1) may send an indication to memory core 325 to identify data to be transmitted to another component of a memory device. In some examples, the identified data may include one or more bits of information. In other examples, the multi-leg driver 300 or the memory controller may identify a desired amplitude level based on the identified data. The multi-leg driver 300 or the memory controller may identify a current amplitude level of the output signal 320 of the multi-leg driver 300 and, in some examples, the multi-leg driver 300 or the memory controller may determine a set of instructions for the pull-up circuit 305 and/or the pull-down circuit 310 to transition from the current amplitude level to the desired amplitude level of the output signal 320. Additionally or alternatively, for example, the instructions may include characteristics of gate voltages (e.g., amplitude of gate voltages, timing of gate voltages, and/or pattern of gate voltage activation) to apply to one or more switching components that couple an output of the multi-leg driver 300 to two or more voltage sources. The instructions may be configured to cause the output signal 320 to be "pulled-up" or "pulled down" to the desired amplitude level.

In some examples, memory core 325 may be coupled with a FIFO component 330. For example, the data transmitted from memory core 325 may be routed through FIFO component 330. FIFO component 330 may, for example, organize and/or manipulate the data transmitted from memory core 325. In some examples, FIFO component 330 may manipulate and/or organize the data according to time and prioritization. Thus FIFO component 330 may process data on a first-come, first-served basis. In some examples, FIFO component 330 may utilize a same clock as a memory controller (e.g., memory controller 110 as described with reference to FIG. 1) that is coupled with multi-leg driver 300. In other examples, FIFO component 330 may utilize separate clocks for reading and writing operations.

In other examples, data transmitted from memory core 325 and through FIFO component 330 may be multiplexed via multiplexer 335. Multiplexer 335 may be coupled with both memory core 325 and FIFO component 330. In some examples, multiplexer 335 may be referred to as MUX 335 and may select one of several input signals received from FIFO component 330. Upon selecting an input signal, multiplexer 335 may forward the signal to pre-driver 340. Pre-driver 340, for example, may be coupled with multiplexer 335 and may utilize a biasing circuit to generate a low-power signal. In some examples, the signal generated via pre-driver 340 may be transmitted to pull-up circuit 305 and/or pull-down circuit 310.

The pull-up circuit 305 may be configured to bias an output signal 320 of the multi-leg driver 300 from a first amplitude to a second amplitude that is greater than the first amplitude. In some examples, pull-up circuit 305 may be referred to as a pull-up transistor 305 and may be or include a transistor. In some cases, the transistor may be a PMOS transistor or an NMOS transistor. For example, if the output signal 320 is at a first amplitude 205-b as described with reference to FIG. 2, the pull-up circuit 305 may be used to transition the output signal 320 to either of amplitude levels 205-c or 205-d. The pull-up circuit 305 may be coupled with a first voltage source using one or more switching components (e.g., a transistor). The first voltage source may have a greater voltage than a second voltage source associated with the pull-down circuit 310.

In some examples, pull-up circuit 305 may be an example of a first transistor of a multi-leg driver (e.g., multi-leg driver 125 as described with reference to FIG. 1). For example, a multi-leg driver may include a first plurality of legs (e.g., channels 115 as described with reference to FIG. 1) coupled with a first resistive component and a second plurality of legs (e.g., channels 115 as described with reference to FIG. 1) coupled with a second resistive component. The first plurality of legs may be configured to output first data that includes multiple bits and the second plurality of legs may be configured to output second data that includes multiple bits. Additionally or alternatively, for example, the multi-leg driver may be coupled with a transmitter and/or a memory controller (e.g., memory controller 110 as described with reference to FIG. 1). The transmitter may be configured to transmit each of the first data and second data, and the memory controller may be configured to determine a peak-to-peak voltage difference (e.g., an output impedance offset) between each of the transmitted data, as described with reference to FIG. 2. Upon determining an output impedance offset, pull-up circuit 305 may be configured to adjust a resistance level of at least one of the first plurality of legs based at least in part on the determination of the output impedance offset. In some examples, pull-up circuit may be configured to adjust an output impedance of the first plurality of legs of the multi-leg driver to a set impedance level.

The pull-down circuit 310 may be configured to bias an output signal 320 of the multi-leg driver 300 from a first amplitude to a second amplitude that is less than the first amplitude. In some examples, pull-down circuit 310 may be referred to as a pull-down transistor 310 and may be or may include a transistor. In some cases, the transistor may be a PMOS transistor or a NMOS transistor. For example, if the output signal 320 is of a first amplitude 205-b, as described with reference to FIG. 2, the pull-down circuit 310 may be used to transition the output signal 320 to amplitude level 205-a. The pull-down circuit 310 may be coupled with a second voltage source using one or more switching components (e.g., a transistor). The second voltage source may have a lesser voltage than the first voltage source associated with the pull-up circuit 305. In some cases, the pull-down circuit 310 selectively couples the output of the multi-leg driver 300 with a ground or virtual ground. Additionally or alternatively, for example, the combination of pull-up circuit 305 and pull-down circuit 310 may be referred to as output driver 315.

In some examples, pull-down circuit 310 may be an example of a second transistor of a multi-leg driver (e.g., multi-leg driver 125 as described with reference to FIG. 1). For example, a multi-leg driver may include a first plurality of legs (e.g., channels 115 as described with reference to FIG. 1) coupled with a first resistive component and a second plurality of legs (e.g., channels 115 as described with reference to FIG. 1) coupled with a second resistive component. The first plurality of legs may be configured to output first data that includes multiple bits and the second plurality of legs may be configured to output second data that includes multiple bits. Additionally or alternatively, for example, the multi-leg driver may be coupled with a transmitter and/or a memory controller (e.g., memory controller 110 as described with reference to FIG. 1). The transmitter may be configured to transmit each of the first data and second data, and the memory controller may be configured to determine a peak-to-peak voltage difference (e.g., an output impedance offset) between each of the transmitted data, as described with reference to FIG. 2. Upon determining an output impedance offset, pull-down circuit 310 may be configured to adjust a resistance level of at least one of the second plurality of legs based at least in part on the determination of the output impedance offset. In some examples, pull-up circuit may be configured to adjust an output impedance of the first plurality of legs of the multi-leg driver to a set impedance level. Additionally or alternatively, for example, each of the first plurality of legs and the second plurality of legs may be associated with a bit of data (e.g., a most significant bit, a least significant bit, another bit of data). For example, the adjustment of the first plurality of legs may include enabling or disabling at least one leg of the plurality that is associated with a bit of data (e.g., either a most-significant bit or a least-significant bit). In other examples, the adjustment of the second plurality of legs may include enabling or disabling at least one leg of the plurality that is associated with a bit of data (e.g., either a most-significant bit or a least-significant bit). The first plurality of legs and the second plurality of legs may each, for example, be associated with a bit of data (e.g., the first plurality of legs may be associated with a most-significant bit and the second plurality of legs may be associated with a least-significant bit). In some examples, the adjustment of the first plurality of legs and the second plurality of legs may occur concurrently or independent of the other.

In some cases, the design of the pull-up circuit 305 and/or the pull-down circuit 310 may affect various characteristics of the output signal 320 as represented by an eye diagram (e.g., eye diagram 200 as described with reference to FIG. 2). For example, the design of the pull-up circuit 305 and/or the pull-down circuit 310 may affect eye width (e.g., width 220 as described with reference to FIG. 2), eye opening (e.g., opening 245 as described with reference to FIG. 2), distortion (e.g., distortion 250 as described with reference to FIG. 2), jitter (e.g., jitter 240 as described with reference to FIG. 2), the location of the amplitude(s), other characteristics, or combinations thereof. As described with reference to FIG. 2, a memory controller (e.g., memory controller 110 as described with reference to FIG. 1) may initiate an adjustment of a resistance level of at least one leg of a first plurality of legs (e.g., channels 115 as described with reference to FIG. 1) of the multi-leg driver to a second resistance level different than a first resistance level based at least in part on a determination of an output impedance offset. In some examples, the initiated adjustment may be performed by pull-up circuit 305 and/or pull-down circuit 310. This adjustment may result in larger, more-uniform eye openings (e.g., eye openings 245 as described with reference to FIG. 2.

In some cases, the multi-leg driver 300 may be configured to selectively generate binary signals (e.g., NRZ signaling) or multi-level signals (e.g., PAM4 or PAM8). In other examples, the multi-leg driver 300 may be configured to adjust a transmit power of the output signal 320 of the multi-leg driver 300. Additionally or alternatively, for example, the multi-leg driver 300 or a memory controller (e.g., memory controller 110 as described with reference to FIG. 1) may be configured to select one or more channels or one or more groups of channels to communicate the output signal 320 to another component of the memory device.

Figure 4:
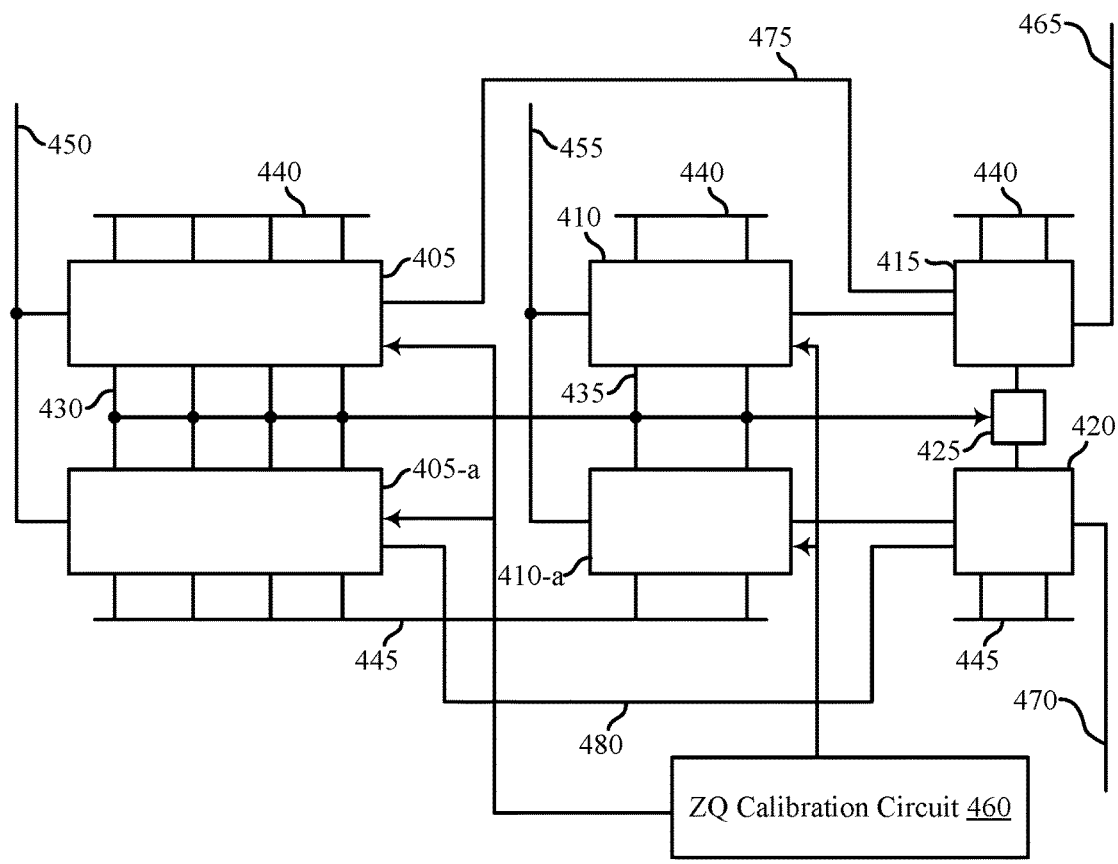
FIG. 4 illustrates an example of a memory device that supports features and operations of improving uniformity between levels of a multi-level signal in accordance with examples of the present disclosure.

FIG. 4 illustrates an example memory device 400 in accordance with various examples of the present disclosure. The memory device 400 may also be referred to as memory driver 400 and may be an example of driver 125 as described with reference to FIG. 1. Memory driver 400 may be configured to utilize multi-level signaling to communicate data between various components of the memory subsystem 100. Memory driver 400 may include resistive components 405 and 405-a, resistive components 410 and 410-a, transistor 415, transistor 420, and transmitter 425.

As described above, memory driver 400 may include resistive components 405 and 405-a. Each of resistive components 405 and 405-a may be coupled with a plurality of legs 430. In some examples, plurality of legs 430 may be referred to as a first plurality of legs 430. Each of the plurality of legs 430 may be coupled with an array of memory cells (e.g., array of memory cells 105 as described with reference to FIG. 1) and may be configured to transport data from the array. For example, each of resistive components 405 and 405-a may be coupled with an array of memory cells via leg 450. In some examples, leg 450 may be able to transport a most-significant bit of data from the memory array and, in other examples, the plurality of legs 430 may be configured to transport a most-significant bit from the memory array. Additionally or alternatively, the plurality of legs 430 may be configured to transport a least significant bit from the memory array. The plurality of legs 430 may be configured to transport a respective bit of data (e.g., either a most-significant bit or a least-significant bit from the memory array), for example, by enabling or disabling one or more of the plurality of legs 430 or by enabling or disabling one or more of the plurality of legs 435. In either instance, each of resistive components 405 and 405-a may be configured to linearize the received data. In other words, resistive components 405 and 405-a may be configured to simultaneously order received addresses in a consecutive manner. In some examples, the memory array may support encoding techniques that may alter a most-significant bit or a least-significant bit, or both. The encoding schemes may include Gray encoding, DBI encoding, error correction code (ECC) encoding, etc.

In some examples, each of resistive components 405 and 405-a may be associated with (e.g., coupled to) any number of resistive units. For example, resistive components 405 and 405-a may be associated with four resistive units. In such an example, each unit may be 240Ω. Because the resistive units may be coupled in parallel, each of resistive components 405 and 405-a may be a 60Ω resistive component.

In some examples, memory driver 400 may include resistive components 410 and 410-a. Each of resistive components 410 and 410-a may be coupled with a plurality of legs 435. In some examples, plurality of legs 435 may be referred to as a second plurality of legs 435. Each of the plurality of legs 435 may be coupled with an array of memory cells (e.g., array of memory cells 105 as described with reference to FIG. 1) and may be configured to transport data from the array. For example, each of resistive components 410 and 410-a may be coupled with an array of memory cells via leg 455. In some examples, leg 455 may be able to transport a least-significant bit of data from the memory array and, in other examples, the plurality of legs 435 may be configured to transport a least-significant bit from the memory array. Additionally or alternatively, the plurality of legs 435 may be configured to transport a most significant bit from the memory array. The plurality of legs 435 may be configured to transport either a most-significant bit or a least-significant bit from the memory array, for example, by enabling or disabling one or more of the plurality of legs 435 or by enabling or disabling one or more of the plurality of legs 430. As described above, in either instance each of resistive components 410 and 410-a may be configured to linearize the received data.

In some examples, each of resistive components 410 and 410-a may be associated with (e.g., coupled to) any number of resistive units. For example, resistive components 410 and 410-a may be associated with two resistive units. In such an example, each unit may be 240Ω. Because the resistive units may be coupled in parallel, each of resistive components 410 and 410-a may be a 120Ω resistive component.

Each of resistive components 405 and 405-a, and 410 and 410-a may be coupled with a transmitter 425, which may be configured to transmit or forward the data received via plurality of legs 430 and 435 onto one or more channels. In some examples, transmitter 425 may be or include an output pad and may be referred to as output pad 425. For example, output pad 425 may output a signal to one or more channels (e.g., channels 115 described with reference to FIG. 1). As described above, each of plurality of legs 430 and 435 may be coupled with an array of memory cells and may be configured to transport data from the array. Because each memory cell of the array may be capable of storing two or more logic states (e.g., a logic '0', a logic '1', a logic '00', a logic '01', a logic '10', a logic '11', etc.), each of plurality of legs 430 and 435 may transport multi-level signals to the transmitter 425. Thus transmitter 425 may transmit multi-level signals to, for example a receiver (e.g., receiver 130 as described with reference to FIG. 1).

Additionally or alternatively, due to the resistive units associated with each of resistive components 405, 405-a, 410, and 410-a, resistive component 405 may possess twice the drive capacity of resistive component 410, and resistive component 405-a may possess twice the drive capacity of resistive component 410-a. In the case of transmitting data "00" (e.g., logic "00"), resistive components 405-a and 410-a may be activated while resistive components 405 and 410 are deactivated. In such an example, transmitter 425 may transmit a signal with amplitude 205-a as described with reference to FIG. 2. In the case of transmitting data "01" (e.g., logic "01"), resistive components 410 and 405-a may be activated while resistive components 405 and 410-a are deactivated.

In such an example, transmitter 425 may transmit a signal with amplitude 205-b, as described with reference to FIG. 2, by driving the input of the transmitter by a ratio of 1:2. In the case of transmitting data "10" (e.g., logic "10"), resistive components 405 and 410-a may be activated while resistive components 405-a and 410 are deactivated. In such an example, transmitter 425 may transmit a signal with amplitude 205-c, as described with reference to FIG. 2, by driving the input of the transmitter by a ratio of 2:1. In the case of transmitting data "11" (e.g., logic "11"), resistive components 405 and 410 may be activated while resistive components 405-a and 410-a are deactivated. In such an example, transmitter 425 may transmit a signal with amplitude 205-d as described with reference to FIG. 2.

In some examples, transmitter 425 may be coupled with a transistor 415. In some examples, transistor 415 may be referred to as first transistor 415. First transistor 415 may be configured to adjust a resistance level of at least one of plurality of legs 430. In other examples, first transistor 415 may be configured to adjust a resistance level of at least one of plurality of legs 435. As shown in FIG. 4, first transistor 415 may be coupled with resistive component 410, which may be associated with a least-significant bit of data. Thus, first transistor 415 may be configured to adjust a resistance level of at least one of the plurality of legs 435 that is associated with a least-significant bit of data. In another example, the first transistor 415 may be coupled with resistive component 405, which may be associated with a most-significant bit of data. The first transistor 415 may be coupled with resistive component 405 via control line 475. Thus, first transistor 415 may be configured to adjust a resistance level of at least one of the plurality of legs 430 that is associated with a most-significant bit of data. In either example, transmitter 425 may transmit data received from an array of memory cells via plurality of legs 430 and 435. The transmitted data may be received (e.g., by receiver 130 as described with reference to FIG. 1) and compared (e.g., by memory controller 110 as described with reference to FIG. 1). In some examples, the data transported via plurality of legs 430 may be offset from the data transported via plurality of legs 435. In some examples, this may be referred to as an output impedance offset. Thus, in some examples, an output offset impedance may be determined (e.g., by memory controller 110 as described with reference to FIG. 1).

Upon determining an output impedance offset, transistor 415 may be configured to adjust a resistance level of plurality of legs 430 or plurality of legs 435. In some examples, transistor 415 may be configured to adjust a resistance level of plurality of legs 430 and plurality of legs 435. By adjusting an output impedance of one or both of plurality of legs 430 and 435, any output impedance offset in the data transmitted via transmitter 425 may be negated. In other examples, transistor 415 may be coupled with a control line 465. Control line may, in some examples, be coupled with leg 450 or leg 455. In other examples, control line 465 may receive one or more signals (e.g., by memory controller 110 as described with reference to FIG. 1), which may allow for transistor 415 to be disabled.

In some examples, a second adjustment of an output impedance of one or both of plurality of legs 430 and 435 may be warranted. For example, transistor 415 may be configured to adjust a resistance level of plurality of legs 430 and plurality of legs 435. Subsequently, for example, an output offset impedance may be re-determined (e.g., by memory controller 110 as described with reference to FIG. 1). Upon a second determination of an output impedance offset, for example, transistor 415 may be configured to adjust the resistance level of plurality of legs 430 or plurality of legs 435 to a different resistance level. In some examples, transistor 415 may be configured to adjust a resistance level of plurality of legs 430 and plurality of legs 435 to a second resistance level. In either occurrence, transistor 415 may be configured to adjust a resistance level of plurality of legs 430 and plurality of legs 435 any number of times to negate any output impedance offset in the data transmitted via transmitter 425.

In other examples, transmitter 425 may be coupled with a transistor 420. In some examples, transistor 420 may be referred to as second transistor 420. Second transistor 420 may be configured to adjust a resistance level of at least one of plurality of legs 430. In other examples, second transistor 420 may be configured to adjust a resistance level of at least one of plurality of legs 435. As shown in FIG. 4, second transistor 420 may be coupled with resistive component 410-a, which may be associated with a least-significant bit of data. Thus, second transistor 420 may be configured to adjust a resistance level of at least one of the plurality of legs 435 that is associated with a least-significant bit of data. In another example, the second transistor 420 may be coupled with resistive component 405-a, which may be associated with a most-significant bit of data. The second transistor 420 may be coupled with resistive component 405-a via control line 480. Thus, second transistor 420 may be configured to adjust a resistance level of at least one of the plurality of legs 430 that is associated with a most-significant bit of data. As described above, in either example, transmitter 425 may transmit data received from an array of memory cells via plurality of legs 430 and 435. The transmitted data may be received and compared (e.g., by memory controller 110 as described with reference to FIG. 1). The compared data may, in some occurrences, be offset.

Upon determining an output impedance offset, transistor 420 may be configured to adjust a resistance level of plurality of legs 430 or plurality of legs 435. In some examples, transistor 420 may be configured to adjust a resistance level of plurality of legs 430 and plurality of legs 435. By adjusting an output impedance of one or both of plurality of legs 430 and 435, any output impedance offset in the data transmitted via transmitter 425 may be negated. In other examples, transistor 420 may be coupled with a control line 470. Control line may, in some examples, be coupled with leg 450 or leg 455. In other examples, control line 470 may receive one or more signals (e.g., by memory controller 110 as described with reference to FIG. 1), which may allow for transistor 420 to be disabled.

In some examples, a second adjustment of an output impedance of one or both of plurality of legs 430 and 435 may be warranted. For example, transistor 420 may be configured to adjust a resistance level of plurality of legs 430 and plurality of legs 435. Subsequently, for example, an output offset impedance may be re-determined (e.g., by memory controller 110 as described with reference to FIG. 1). Upon a second determination of an output impedance offset, for example, transistor 420 may be configured to adjust the resistance level of plurality of legs 430 or plurality of legs 435 to a different resistance level. In some examples, transistor 420 may be configured to adjust a resistance level of plurality of legs 430 and plurality of legs 435 to a second resistance level. In either occurrence, transistor 420 may be configured to adjust a resistance level of plurality of legs 430 and plurality of legs 435 any number of times to negate any output impedance offset in the data transmitted via transmitter 425.

Additionally or alternatively, for example, first transistor 415 and second transistor 420 may operate independent of the other, or in conjunction with the other. For example, first transistor 415 may adjust the output impedance of one or both of plurality of legs 430 and 435 while second transistor 420 is kept in an inactive, or bypass, state. In other examples, second transistor 420 may adjust the output impedance of one or both of plurality of legs 430 and 435 while first transistor 415 is kept in an inactive, or bypass, state. In further examples, first transistor 415 may adjust the output impedance for one of plurality of legs 430 or 435, and second transistor 420 may adjust the output impedance of the opposite leg.

In the examples described above, each of resistive component 405, resistive component 410, and transistor 415 may be coupled with supply voltage 440. Supply voltage 440, which may be referred to as VDDQ 440, may be a common supply for memory device 400, an I/O controller (not illustrated), and any logic associated with memory device 400. Additionally or alternatively, for example, each of resistive component 405-a, resistive component 410-a, and transistor 420 may be coupled with a negative supply voltage 445. In some examples, negative supply voltage 445 may be a field-effect transistor (FET).

In some examples, the memory device 400 may include a ZQ calibration circuit 460. The ZQ calibration circuit 460 may operate to adjust an impedance level of resistive components 405, 405-a, 410, and 410-a. For example, the ZQ calibration circuit 460 may transmit one or more signals to any one of resistive components 405, 405-a, 410, and 410-a. The signals may correspond to a value of or close to the intended impedance of the respective resistive component. Thus, in the example discussed above (e.g., 60Ω and 120Ω resistive components), the ZQ calibration circuit 460 may transmit a signal corresponding to 60Ω to one or more of resistive components 405 and 405-a and transmit a signal corresponding to 120Ω to one or more of resistive components 410 and 410-a. Accordingly, ZQ calibration circuit 460 may set, or aid in setting, the impedance values of resistive components 405, 405-a, 410, and 410-a to a desired level.

Figure 5:
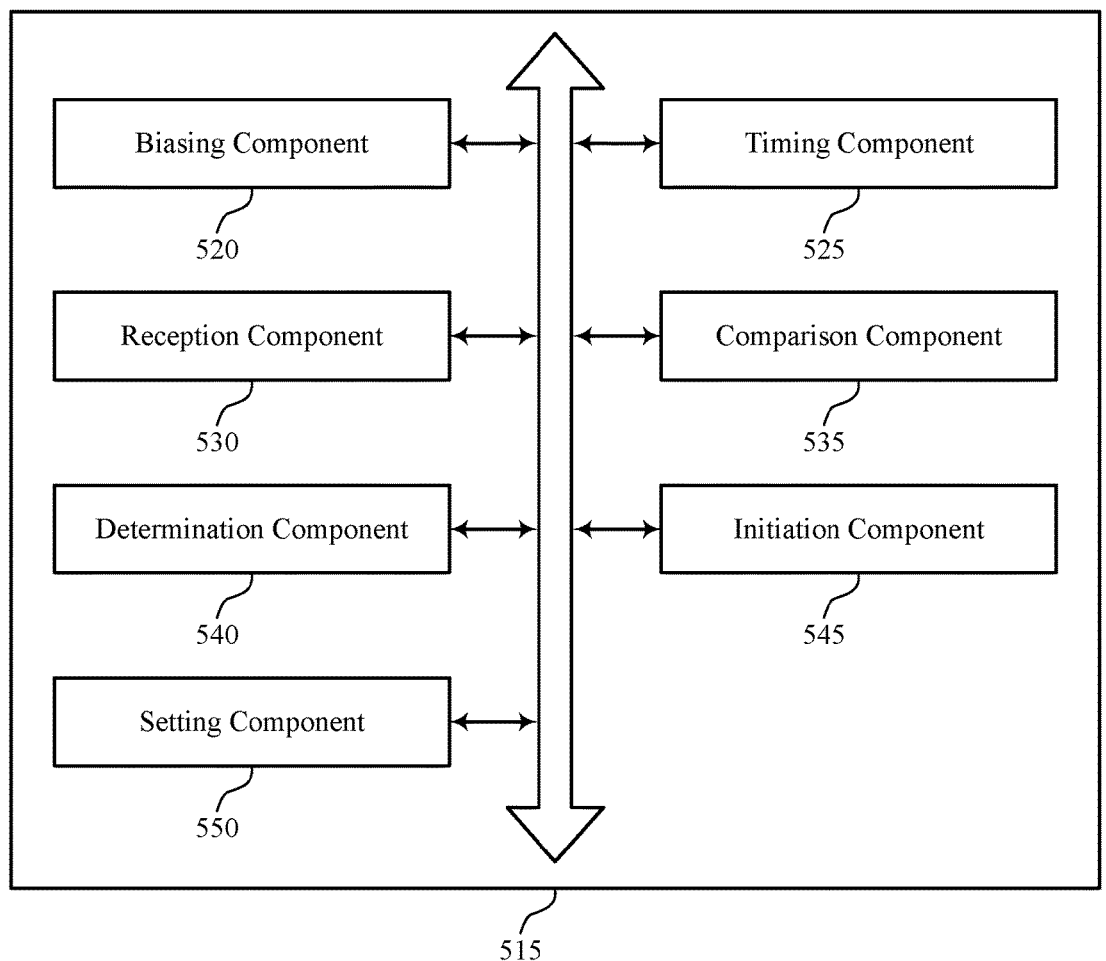
FIG. 5 illustrates an example of a memory device that supports features and operations of improving uniformity between levels of a multi-level signal in accordance with examples of the present disclosure.

FIG. 5 illustrates a block diagram 500 of a memory controller 515 that supports improving uniformity between levels of a multi-level signal in accordance with examples of the present disclosure. The memory controller 515 may be an example of aspects of a memory controller 110 described with reference to FIGS. 1-4. The memory controller 515 may include biasing component 520, timing component 525, reception component 530, comparison component 535, determination component 540, initiation component 545, and setting component 550. Each of these modules may communicate, directly or indirectly, with one another (e.g., via one or more buses).

Reception component 530 may receive first data and second data output from a transmitter (e.g., transmitter 425 as described with reference to FIG. 4) coupled with a multi-leg driver. In some examples, each of the first data and the second data may include multiple bits. For example, reception component 530 may include measuring an amplitude of each of the first data and the second data.

Comparison component 535 may compare the first data and the second data output from the transmitter (e.g., transmitter 425 as described with reference to FIG. 4). In some examples, comparison component 535 may operate in response to reception component 530 receiving first data and second data output from the transmitter.

Determination component 540 may determine an output impedance offset between the first data and the second data. In some examples, determination component 540 may make a determination of the data compared by comparison component 535 in response to the first data and the second data being output from the transmitter (e.g., transmitter 425 as described with reference to FIG. 4). In other examples, determination component 540 may operate in response to a first adjustment to a resistance level of at least one leg (e.g., plurality of legs 430 as described with reference to FIG. 4) of a first plurality of legs of the multi-leg driver. Additionally or alternatively, for example, determination component 540 may operate in response to a first adjustment to a resistance level of at least one leg (e.g., plurality of legs 435 as described with reference to FIG. 4) of a second plurality of legs of the multi-leg driver.

Initiation component 545 may initiate an adjustment of a resistance level of at least one leg of a first plurality of legs (e.g., plurality of legs 430 as described with reference to FIG. 4) of the multi-leg driver to a second resistance level different than a first resistance level. Initiation component 545 may operate in response to determination component 540 determining an output impedance offset between the first data and the second data. In some examples, initiation component 545 may enable at least one leg of the first plurality of legs. In other examples, initiation component 545 may disable at least one leg of the first plurality of legs. Additionally or alternatively, for example, initiation component 545 may initiate an adjustment of the second resistance level of the first plurality of legs to a third resistance level different than the second resistance level. In other examples, initiation component 545 may enable at least one leg of the first leg group based at least in part on the determined output impedance offset and initiation component 545 may disable at least one leg of the first leg group based at least in part on the determined output impedance offset.

Setting component 550 may set an output impedance of each of the first plurality of legs (e.g., plurality of legs 430 as described with reference to FIG. 4) of the multi-leg driver based at least in part on the second resistance level. Setting component 550 may operate in response to initiation component 545 initiating an adjustment of a resistance level of at least one leg of a first plurality of legs to a second resistance level different than a first resistance level.

Figure 6:
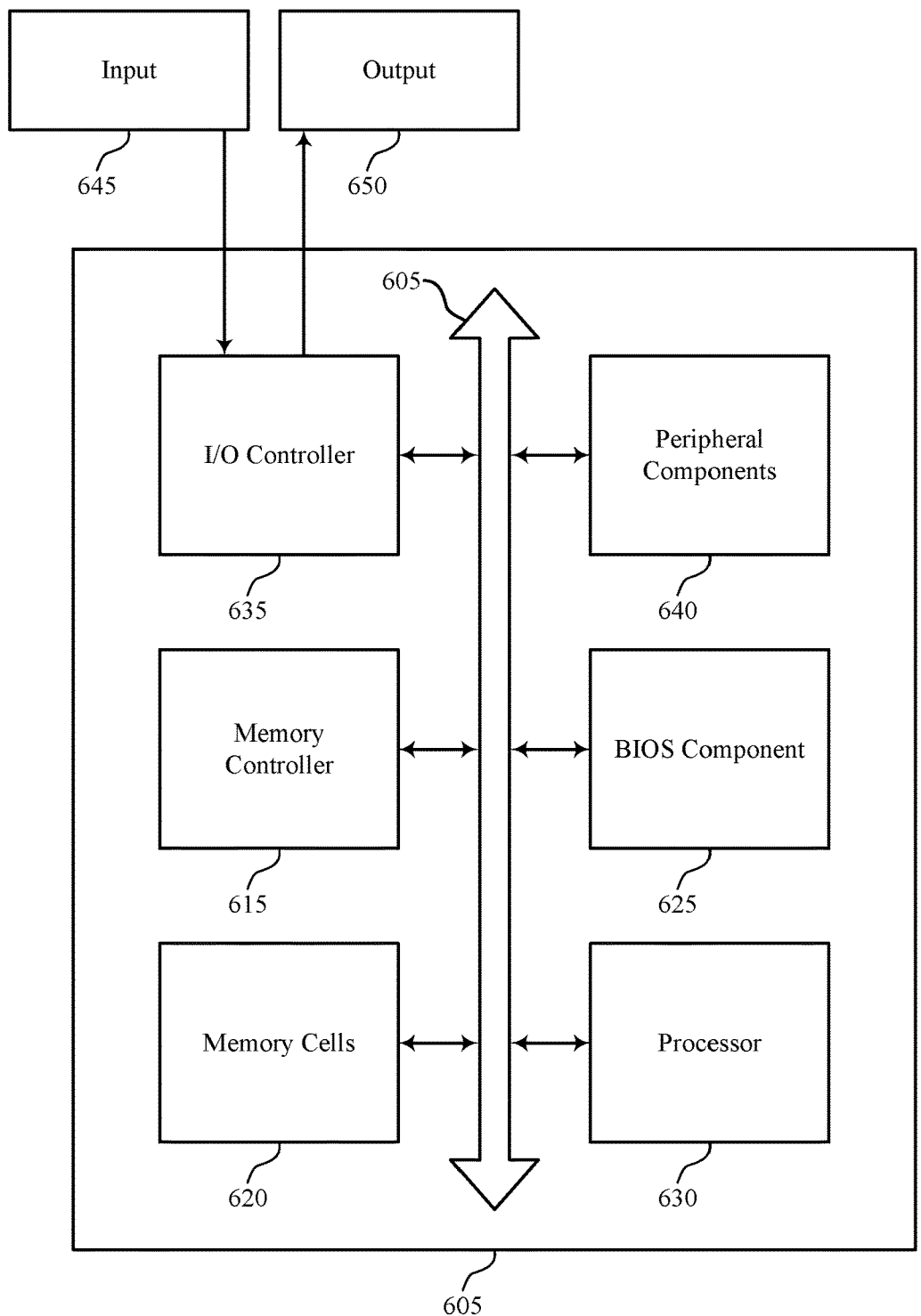
FIG. 6 illustrates an example of a memory device that supports features and operations of improving uniformity between levels of a multi-level signal in accordance with examples of the present disclosure.

FIG. 6 illustrates a diagram of a system 600 including a device 605 that supports improving uniformity between levels of a multi-level signal in accordance with examples of the present disclosure. Device 605 may be an example of or include the components of multi-leg driver 400 as described above, e.g., with reference to FIG. 4. Device 605 may include components for bi-directional voice and data communications including components for transmitting and receiving communications, including memory controller 615, memory cells 620, basic input/output system (BIOS) component 625, processor 630, I/O controller 635, and peripheral components 640. These components may be in electronic communication via one or more buses (e.g., bus 610).

Memory controller 615 may operate one or more memory cells as described herein. Specifically, memory controller 615 may be configured to support improving uniformity between levels of a multi-level signal. In some cases, memory controller 615 may include a row decoder, column decoder, or both, as described herein (not shown).

Memory cells 620 may store information (i.e., in the form of a logical state) as described herein.

BIOS component 625 be a software component that includes BIOS operated as firmware, which may initialize and run various hardware components. BIOS component 625 may also manage data flow between a processor and various other components, e.g., peripheral components, input/output control component, etc. BIOS component 625 may include a program or software stored in read only memory (ROM), flash memory, or any other non-volatile memory.

Processor 630 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 630 may be configured to operate a memory array using a memory controller. In other cases, a memory controller may be integrated into processor 630. Processor 630 may be configured to execute computer-readable instructions stored in a memory to perform various functions (e.g., functions or tasks supporting improving uniformity between levels of a multi-level signal).

I/O controller 635 may manage input and output signals for device 605. I/O controller 635 may also manage peripherals not integrated into device 605. In some cases, I/O controller 635 may represent a physical connection or port to an external peripheral. In some cases, I/O controller 635 may utilize an operating system such as iOS®, ANDROID®, MS-DOS®, MS-WINDOWS®, OS/2®, UNIX®, LINUX®, or another known operating system. In other cases, I/O controller 635 may represent or interact with a modem, a keyboard, a mouse, a touchscreen, or a similar device. In some cases, I/O controller 635 may be implemented as part of a processor. In some cases, a user may interact with device 605 via I/O controller 635 or via hardware components controlled by I/O controller 635.

Peripheral components 640 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 645 may represent a device or signal external to device 605 that provides input to device 605 or its components. This may include a user interface or an interface with or between other devices. In some cases, input 645 may be managed by I/O controller 635, and may interact with device 605 via a peripheral component 640.

Output 650 may also represent a device or signal external to device 605 configured to receive output from device 605 or any of its components. Examples of output 650 may include a display, audio speakers, a printing device, another processor or printed circuit board, etc. In some cases, output 650 may be a peripheral element that interfaces with device 605 via peripheral component(s) 640. In some cases, output 650 may be managed by I/O controller 635

The components of device 605 may include circuitry designed to carry out their functions. This may include various circuit elements, for example, conductive lines, transistors, capacitors, inductors, resistors, amplifiers, or other active or inactive elements, configured to carry out the functions described herein. Device 605 may be a computer, a server, a laptop computer, a notebook computer, a tablet computer, a mobile phone, a wearable electronic device, a personal electronic device, or the like. Or device 605 may be a portion or aspect of such a device.

Figure 7:
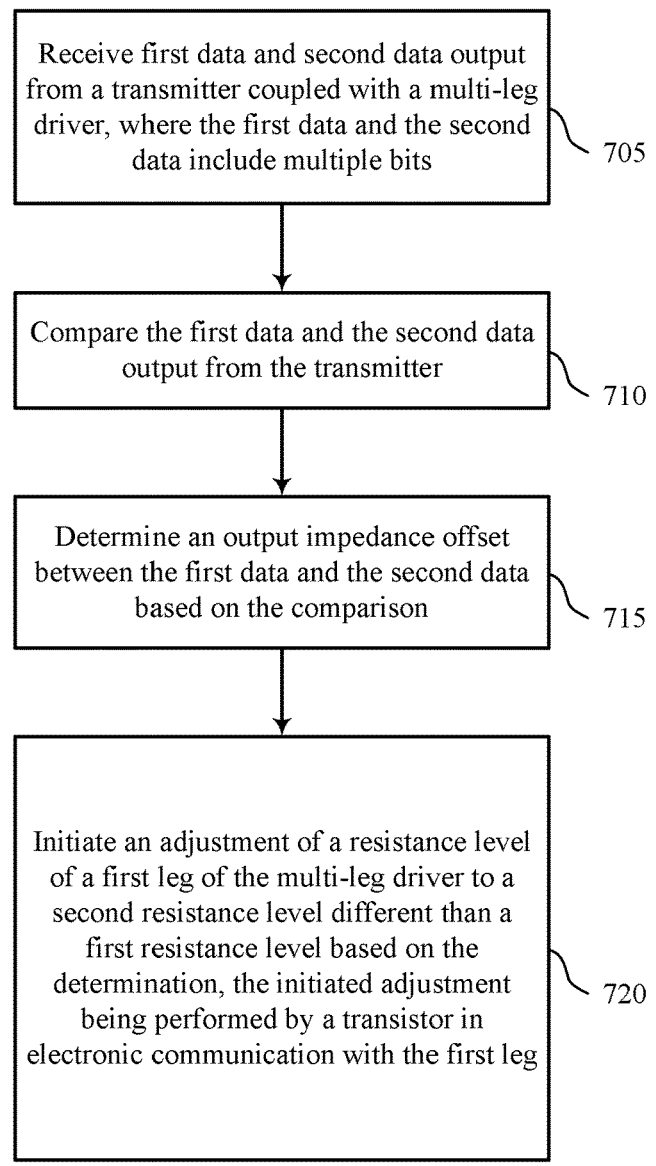
FIG. 7 is a flowchart that illustrates a method or methods for improving uniformity between levels of a multi-level signal in accordance with examples of the present disclosure.

FIG. 7 illustrates a flowchart illustrating a method 700 for improving uniformity between levels of a multi-level signal in accordance with examples of the present disclosure. The operations of method 700 may be implemented by a multi-leg driver (e.g., multi-leg driver 400 as described with reference to FIG. 4) or its components as described herein. For example, the operations of method 700 may be performed by a memory controller as described with reference to FIGS. 1 through 6. In some examples, a multi-leg driver may execute a set of codes to control the functional elements of the device to perform the functions described below. Additionally or alternatively, for example, the multi-leg driver may perform aspects of the functions described below using special-purpose hardware.

At block 705 the multi-leg driver may receive first data and second data output from a transmitter coupled with a multi-leg driver. In some examples, the first data and the second data may include multiple bits. The operations of block 705 may be performed according to the methods described herein. In certain examples, aspects of the operations of block 705 may be performed by a reception component as described with reference to FIG. 5.

At block 710 the multi-leg driver may compare the first data and the second data output from the transmitter. The operations of block 710 may be performed according to the methods described herein. In certain examples, aspects of the operations of block 710 may be performed by a comparison component as described with reference to FIG. 5.

At block 715 the multi-leg driver may determine an output impedance offset between the first data and the second data. The output impedance offset may be determined based at least in part on the comparison. The operations of block 715 may be performed according to the methods described herein. In certain examples, aspects of the operations of block 715 may be performed by a determination component as described with reference to FIG. 5.

At block 720 the multi-leg driver may initiate an adjustment of a resistance level of at least one leg of a first plurality of legs of the multi-leg driver to a second resistance level different than a first resistance level. The adjustment may be based at least in part on the determination and may be performed by a transistor in electronic communication with at least one of the first plurality of legs. The operations of block 720 may be performed according to the methods described herein. In certain examples, aspects of the operations of block 720 may be performed by an initiation component as described with reference to FIG. 5.

In some cases, the methods described herein may also include receiving first data and second data output from a transmitter coupled with a multi-leg driver. In some examples, each of the first data and the second data may include multiple bits. In other examples, the method may include comparing the first data and the second data output from the transmitter and determining an output impedance offset between the first data and the second data based at least in part on the comparison.

In some instances, method may include initiating an adjustment of a resistance level of at least one leg of a first plurality of legs of the multi-leg driver to a second resistance level different than a first resistance level. The adjustment may be based at least in part on the determination and may be performed by a transistor in electronic communication with at least one of the first plurality of legs. Additionally or alternatively, for example, the method may include setting an output impedance of each of the first plurality of legs of the multi-leg driver. The output impedance may be set based at least in part on the second resistance level.

In some examples, the initiation of the adjustment of the first resistance level may include enabling at least one leg of the first plurality of legs. Each of the first plurality of legs may be associated with a most significant bit or a least significant bit. In other instances, the initiation of the adjustment of the first resistance level may include disabling at least one leg of the first plurality of legs. Each of the first plurality of legs may be associated with a most significant bit or a least significant bit.

Additionally or alternatively, for example, the method may include determining the output impedance offset between the first data and the second data after the adjustment to the second resistance level. In some cases, the method may include initiating an adjustment of the second resistance level of the first plurality of legs to a third resistance level different than the second resistance level. This initiation may be based at least in part on the determination of the output impedance offset after the adjustment to the second resistance level.

In other examples, a device or system may include a multi-leg driver that comprises a first plurality of legs coupled with a first resistive component and a second plurality of legs coupled with a second resistive component, wherein the first plurality of legs is configured to output first data that includes multiple bits and the second plurality of legs is configured to output second data that includes multiple bits, a transmitter coupled with the first resistive component and the second resistive component of the multi-leg driver, the transmitter being configured to transmit the first data and the second data, a controller coupled with the multi-leg driver, the controller being configured to determine an output impedance offset between the first transmitted data and the second transmitted data, and a first transistor coupled with the transmitter, the first transistor configured to adjust a resistance level of at least one of the first plurality of legs based at least in part on the determination.

In some examples, the device or system described above may also include a second transistor coupled with the transmitter, the second transistor being configured to adjust a resistance level of at least one of the second plurality of legs in response to the determination. Additionally or alternatively, for example, in some examples the first transistor may be a pull-up transistor and the second transistor may be a pull-down transistor. In other examples, the pull-up transistor may be a PMOS transistor and the pull-down transistor may be a NMOS transistor. In some examples, the pull-up transistor and the pull-down transistor may be NMOS transistors.

In other examples, the first transistor may be configured to adjust an output impedance of the first plurality of legs of the multi-leg driver to a set impedance level. In some examples, the second transistor may be configured to adjust an output impedance of the second plurality of legs of the multi-leg driver to the set impedance level. Additionally or alternatively, for example, the first transistor may be configured to adjust the output impedance from the first plurality of legs of the multi-leg driver by enabling at least one leg of the first plurality of legs. In some examples, the first transistor may be configured to adjust the output impedance from the first plurality of legs of the multi-leg driver by disabling at least one leg of the first plurality of legs.

In some examples, a method of operating a memory array may be described. The method may include receiving first data and second data output from a transmitter coupled with a multi-leg driver, wherein the first data and the second data include multiple bits, comparing the first data and the second data output from the transmitter, determining an output impedance offset between the first data and the second data based at least in part on the comparison, and initiating an adjustment of a resistance level of at least one leg of a first plurality of legs of the multi-leg driver to a second resistance level different than a first resistance level based at least in part on the determination, the initiated adjustment being performed by a transistor in electronic communication with at least one of the first plurality of legs.

Some examples of the method described above may further include processes, features, means, or instructions for setting an output impedance of each of the first plurality of legs of the multi-leg driver based at least in part on the second resistance level. In some examples of the method described above, the initiation of the adjustment of the first resistance level comprises enabling at least one leg of the first plurality of legs, wherein each the first plurality of legs may be associated with a most significant bit or a least significant bit. In other examples of the method described above, the initiation of the adjustment of the first resistance level comprises disabling at least one leg of the first plurality of legs, wherein each the first plurality of legs may be associated with a most significant bit or a least significant bit.

Some examples of the method described above may further include processes, features, means, or instructions for determining the output impedance offset between the first data and the second data after the adjustment to the second resistance level. Some examples of the method described above may further include processes, features, means, or instructions for initiating an adjustment of the second resistance level of the first plurality of legs to a third resistance level different than the second resistance level, wherein the initiation of the adjustment to the third resistance level may be based at least in part on the determination of the output impedance offset after the adjustment to the second resistance level.

In one example, a device or system may include a multi-leg driver that comprises a first leg group coupled with a first resistive component and a second leg group coupled with a second resistive component, wherein the first leg group is configured to output first data that includes multiple bits and the second leg group is configured to output second data that includes multiple bits, a transmitter coupled with the first resistive component and the second resistive component, the transmitter being configured to output the first data and the second data, a first transistor coupled with the transmitter, a controller coupled with the multi-leg driver, wherein the controller is operable to: receive the first data and the second data output from the transmitter, compare the first data and the second data output from the transmitter, determine an output impedance offset between the first data and the second data in response to the comparison, and initiate an adjustment of a resistance level of at least one leg of the first leg group of the multi-leg driver to a second resistance level different than a first resistance level based at least in part on the determination, the initiated adjustment being performed by the first transistor in electronic communication with at least one of the first plurality of legs.

In some examples of the device or system described above, the controller may be further operable to initiate an adjustment of a resistance level of at least one leg of the second leg group to a second resistance level different than a first resistance level based at least in part on the determination, wherein the second resistance level of the at least one leg of the first leg group and the second resistance level of the at least one leg of the second leg group may be uniform. In other examples, the adjusted resistance level of the at least one leg of the first leg group or the at least one leg of the second leg group may be based at least in part on adjusting a resistance of the first transistor.

In some examples of the device or system described above, the reception of the first data and the second data output from the transmitter further comprises: measuring an amplitude of each of the first data and the second data. In other examples of the device or system described above, the initiation of the adjustment of the first resistance level of the at least one leg of the first leg group further comprises: enabling the at least one leg of the first leg group based at least in part on the determined output impedance offset. Additionally or alternatively, for example, the initiation of the adjustment of the first resistance level of the at least one leg of the first leg group further comprises: disabling the at least one leg of the first leg group based at least in part on the determined output impedance offset.

It should be noted that the methods described above describe possible implementations, and that the operations and the steps may be rearranged or otherwise modified and that other implementations are possible. Furthermore, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled with one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including array of memory cells 105, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a multi-leg driver that comprises a first plurality of legs coupled with a first resistive component and a second plurality of legs coupled with a second resistive component, wherein the first plurality of legs is configured to output first data that includes multiple bits and the second plurality of legs is configured to output second data that includes multiple bits;
   a transmitter coupled with the first resistive component and the second resistive component of the multi-leg driver, the transmitter being configured to transmit the first data and the second data;
   a controller coupled with the multi-leg driver, the controller being configured to determine an output impedance offset between the first transmitted data and the second transmitted data; and
   a first transistor coupled with the transmitter, the first transistor configured to adjust a resistance level of at least one of the first plurality of legs based at least in part on the controller determining the output impedance offset between the first transmitted data and the second transmitted data.

2. The apparatus of claim 1, further comprising:
a second transistor coupled with the transmitter, the second transistor being configured to adjust a resistance level of at least one of the second plurality of legs in response to the determination.

3. The apparatus of claim 2, wherein the first transistor is a pull-up transistor and the second transistor is a pull-down transistor.

4. The apparatus of claim 2, wherein the first transistor is configured to adjust an output impedance of the first plurality of legs of the multi-leg driver to a set impedance level.

5. The apparatus of claim 4, wherein the second transistor is configured to adjust an output impedance of the second plurality of legs of the multi-leg driver to the set impedance level.

6. The apparatus of claim 4, wherein the first transistor is configured to adjust the output impedance from the first plurality of legs of the multi-leg driver by enabling at least one leg of the first plurality of legs.

7. The apparatus of claim 4, wherein the first transistor is configured to adjust the output impedance from the first plurality of legs of the multi-leg driver by disabling at least one leg of the first plurality of legs.

8. The apparatus of claim 3, wherein the pull-up transistor is a PMOS transistor and the pull-down transistor is an NMOS transistor.

9. The apparatus of claim 3, wherein the pull-up transistor and the pull-down transistor are NMOS transistors.

10. A method, comprising:
receiving first data and second data output from a transmitter coupled with a multi-leg driver, wherein the first data and the second data include multiple bits;
comparing the first data and the second data output from the transmitter;
determining an output impedance offset between the first data and the second data based at least in part on the comparison; and
initiating an adjustment of a resistance level of a first leg of the multi-leg driver to a second resistance level different than a first resistance level based at least in part on determining the output impedance offset between the first data and the second data, the initiated adjustment being performed by a transistor in electronic communication with the first leg.

11. The method of claim 10, further comprising:
setting an output impedance of the first leg of the multi-leg driver based at least in part on the second resistance level.

12. The method of claim 10, wherein the initiation of the adjustment of the first resistance level comprises enabling the first leg, wherein the first leg is associated with a most significant bit or a least significant bit.

13. The method of claim 10, wherein the initiation of the adjustment of the first resistance level comprises disabling the first leg, wherein the first leg is associated with a most significant bit or a least significant bit.

14. The method of claim 10, further comprising:
determining the output impedance offset between the first data and the second data after the adjustment to the second resistance level; and
initiating an adjustment of the second resistance level of the first leg to a third resistance level different than the second resistance level, wherein the initiation of the adjustment to the third resistance level is based at least in part on the determination of the output impedance offset after the adjustment to the second resistance level.

15. An apparatus, comprising:
a multi-leg driver that comprises a first leg group coupled with a first resistive component and a second leg group coupled with a second resistive component, wherein the first leg group is configured to output first data and the second leg group is configured to output second data;
a transmitter coupled with the first resistive component and the second resistive component, the transmitter being configured to output the first data and the second data;
a first transistor coupled with the transmitter; and
a controller coupled with the multi-leg driver, wherein the controller is operable to:
receive the first data and the second data output from the transmitter;
compare the first data and the second data output from the transmitter;
determine an output impedance offset between the first data and the second data in response to the comparison; and
initiate an adjustment of a resistance level of at least one leg of the first leg group of the multi-leg driver to a second resistance level different than a first resistance level based at least in part on determining the output impedance offset between the first data and the second data, the initiated adjustment being performed by the first transistor in electronic communication with at least one of the first plurality of legs.

16. The apparatus of claim 15, wherein the controller is further operable to:
initiate an adjustment of a resistance level of at least one leg of the second leg group to a second resistance level different than a first resistance level based at least in part on the determination, wherein the second resistance level of the at least one leg of the first leg group and the second resistance level of the at least one leg of the second leg group are uniform.

17. The apparatus of claim 16, wherein the adjusted resistance level of the at least one leg of the first leg group or the at least one leg of the second leg group is based at least in part on adjusting a resistance of the first transistor.

18. The apparatus of claim 15, wherein the reception of the first data and the second data output from the transmitter further comprises:
measuring an amplitude of each of the first data and the second data.

19. The apparatus of claim 15, wherein the initiation of the adjustment of the first resistance level of the at least one leg of the first leg group further comprises:
enabling the at least one leg of the first leg group based at least in part on the determined output impedance offset.

20. The apparatus of claim 15, wherein the initiation of the adjustment of the first resistance level of the at least one leg of the first leg group further comprises:
disabling the at least one leg of the first leg group based at least in part on the determined output impedance offset.

* * * * *